United States Patent [19]
Laermer et al.

[11] Patent Number: 6,127,273
[45] Date of Patent: Oct. 3, 2000

[54] PROCESS FOR ANISOTROPIC PLASMA ETCHING OF DIFFERENT SUBSTRATES

[75] Inventors: Franz Laermer, Stuttgart; Andrea Schilp, Schwaebisch Gmuend, both of Germany

[73] Assignee: Robert Bosch GmbH, Stuttgart, Germany

[21] Appl. No.: 09/091,031

[22] PCT Filed: Oct. 6, 1997

[86] PCT No.: PCT/DE97/02272

§ 371 Date: Sep. 28, 1998

§ 102(e) Date: Sep. 28, 1998

[87] PCT Pub. No.: WO98/15972

PCT Pub. Date: Apr. 16, 1998

[30] Foreign Application Priority Data

Oct. 7, 1996 [DE] Germany .................. 196 41 288

[51] Int. Cl.[7] .................................................. H01L 21/00
[52] U.S. Cl. ........................ 438/709; 438/710; 438/712
[58] Field of Search .................... 438/710, 709, 438/712

[56] References Cited

U.S. PATENT DOCUMENTS

| | | |
|---|---|---|
| 3,992,099 | 11/1976 | Laughlin . |
| 4,037,959 | 7/1977 | Bumgardner . |
| 4,184,767 | 1/1980 | Hughes et al. . |
| 4,674,871 | 6/1987 | Shifrin . |
| 5,043,726 | 8/1991 | Shifrin . |
| 5,453,156 | 9/1995 | Cher et al. .................. 156/643.1 |
| 5,624,582 | 4/1997 | Cain .............................. 438/715 |

Primary Examiner—Felisa Hiteshew
Assistant Examiner—Vanessa Perez-Ramos
Attorney, Agent, or Firm—Kenyon & Kenyon

[57] ABSTRACT

A method of producing etched structures in substrates by anisotropic plasma etching, wherein an essentially isotropic etching operation and side wall passivation are performed separately and in alternation, with the substrate being a polymer, a metal or a multicomponent system, and portions of the side wall passivation layer applied during passivation of the side wall are transferred to the exposed side surfaces of the side wall during the subsequent etching operations, so the entire method is anisotropic as a whole.

26 Claims, 2 Drawing Sheets

PROCESS FOR ANISOTROPIC PLASMA ETCHING OF DIFFERENT SUBSTRATES

FIELD OF THE INVENTION

The present invention relates to a method of anisotropic plasma etching of substrates.

BACKGROUND OF THE INVENTION

Structuring of silicon by plasma etching methods is known. In plasma etching methods, chemically reactive etchant species and electrically charged particles, i.e., ions, are produced in a reactor with the help of an electric discharge in a reactive gas mixture. Positively charged ions generated in this way are accelerated toward the substrate by an electric bias applied to the silicon substrate, so they strike the substrate surface approximately perpendicularly, promoting the chemical reaction of the reactive etchant species with silicon on the substrate to be etched. A distinction is made between ion-induced anisotropic plasma etching, wherein the etching action of the etchant species is linked to a high-energy current of ions toward the substrate surface, and spontaneous isotropic plasma etching, wherein the etchant species require very little or no ion support. Ion-induced plasma etching, which is preferably performed with less reactive halogens such as chlorine or bromine when silicon is the material to be structured, has comparatively low erosion rates and is extremely susceptible to moisture and plasma impurities. However, spontaneous plasma etching, which is performed mainly with fluorine gases when silicon is the material to be structured, has high etching rates and, furthermore, highenergy ions are not needed. Therefore, in a search for suitable mask materials, only chemical factors regarding the selectivity between mask and substance to be etched need be taken into account, thus greatly expanding the selection options. In many cases, when materials other than silicon are to be structured, masking is possible, if at all, only with spontaneously reactive plasma chemistry. A very high mask selectivity can be achieved with this approach, because very little or no ion-induced or physical mask erosion occurs at low ion energies, and purely chemical reactions are extremely material-selective. Likewise, because of the low ion energies, no micromasking occurs on etching surfaces due to atomization and redeposition of mask material that has been vaporized or reacted to form a nonvolatile product, so that smooth etching surfaces without any unwanted structures are obtained. Nevertheless, there is little or no use for spontaneously reacting etchant species in plasma methods because they perform etching isotropically, i.e., they also etch under the edges of the mask, due to their spontaneous reaction properties. However, high anisotropy without underetching beneath the mask is advantageous for accurate transfer of structure.

A known possibility of combining the advantages of spontaneous and ion-induced plasma etching is to use side wall protection by a thin film deposited during the operation. Only a few ions strike the side wall of the structures to be etched, so it is coated by a film of inorganic or organic material, e.g., a polymer, from the plasma and is thus protected from attack by the spontaneously reacting etchant species. The substrate remains free of this protective film due to the simultaneous action of a high current of low-energy ions, and therefore it can be etched at a high rate. This yields anisotropic profiles and prevents underetching of the edges of the mask. However, when protective species, i.e., passivating species, are present in the plasma simultaneously with aggressive species, i.e., etchant species, this yields the disadvantage that strong recombination of the unsaturated passivation species with the spontaneously reacting etchant species eliminates these species in pairs as they form an inert reaction product, which greatly reduces the density of the available active species. To prevent this recombination of etchant species and passivation species, these species are separated from one another and used in alternation in a method according to the present invention. However, a new side wall area is exposed during each etching step and cannot be covered again and protected until the next passivation step, so a marked scoring of the side wall would normally result with this procedure. This effect is extremely undesirable and would make this method useless per se; according to this approach, this scoring could be avoided only by selecting a very small width and therefore a short duration of the individual etching step, but this in turn results in a very low etching speed or extremely frequent short-term alternations between etching and passivation, which would not be feasible because of the gas volumes in the supply lines and the plasma chamber, which also makes the latter method useless.

SUMMARY OF THE INVENTION

A method according to the present invention has an advantage over the related art that it uses spontaneously reacting etchant species capable of anisotropic structuring of a number of materials, specifically polymers, metals or multicomponent systems, at high erosion rates. Thus, anisotropic structuring of substances that are difficult to etch and form less volatile compounds at room temperature and therefore must be atomized by using high-energy ions in a conventional manner can be performed at elevated temperatures and with a low ion energy in an advantageous manner.

The present invention provides that some, but not all of the side wall passivation layer applied during a side wall passivation step be eroded during the etching operation. The eroded material remains in front of or in the immediate vicinity of the side wall during the etching operation and is driven forward by the type of erosion in the direction of the etching operation, where it can be deposited again beneath the original side wall passivation edge. The original side wall passivation layer thus becomes thinner and is pulled downward over the newly formed side wall surfaces as etching progresses, so that these surfaces are protected immediately upon exposure, rather than later, in the next side wall passivation step. Then, in the next side wall passivation, the original passivation layer and that over the newly formed side wall surface are again increased in thickness to approximately the original thickness before being etched again, and the layer is pulled slightly downward again. Due to this effect, an essentially isotropic etching effect becomes anisotropic locally, namely in the immediate vicinity of the lower edge of the passivation layer. The forward advance of the side wall passivation layer is driven mainly by an accurately dimensioned dose or quantity of ions, which do not act on the ground of the structure exactly at a right angle but instead have a small angle of bombardment and therefore strike the side wall passivation layer. A certain amount of obliquely incident ions is always present in plasma etching methods, but this is normally extremely undesirable because it leads to ion-induced side wall etching and thus to undercutting of the mask edges, which is equivalent to a loss of anisotropy and structural fidelity. With the method according to the present invention, an accurately dimensioned oblique bombardment of ions is used to drive the protective film forward in a controlled manner. An inherent interference effect is brought under control through a choice of suitable conditions and is utilized advantageously.

Thus, the advantages of isotropically, i.e., spontaneously, reacting etchant species are retained in an advantageous manner and at least the feature of anisotropy is added. Due to the separate use of etchant species and passivation species in different process steps, recombination and extinction of pairs of chemically active species are prevented. Since spontaneously reacting etchant species with very high etching rates can be used, the erosion rates of typical ion-induced processes are far exceeded.

The method according to the present invention has proven to be especially advantageous when suitable mask materials are sought for substances that are difficult to etch, because the boundary conditions of mask selection in spontaneously reacting chemistry entail far fewer restrictions. Only low-energy ions are used according to the present invention, so there is a high selectivity with respect to a wide range of mask materials. Since the low-energy ions do not damage the mask material, only their chemical properties need be taken into account when selecting mask materials. There is hardly any ion-induced mask erosion or atomization and redeposition of the mask.

In an especially advantageous manner, anisotropic etching can be performed with the method according to the present invention, using nonspecific, spontaneously reacting etchant species with the greatest possible aggressiveness with respect to the material to be etched. It is possible, for example, to etch metals or polymers as substrates designed as multicomponent systems. In conjunction with the present invention, a multicomponent system is understood to be a substrate composed of different material ingredients, such as, for example, gallium/arsenic or gallium/aluminum/arsenic. Many multicomponent systems have in common the fact that they are difficult to etch anisotropically with the ion-induced etchant species traditionally used for this purpose, and the erosion rates are low. Anisotropic etching in multicomponent systems instead requires nonspecific etching of the various material ingredients, which is made possible through the present invention, where there is no accumulation of gallium, aluminum or arsenic, for example, on the base of the structure during the etching operation. Substrates of gallium/arsenic or gallium/aluminum/arsenic, for example, can be structured anisotropically by using chlorine in an especially advantageous manner by the method according to the present invention. The present invention contemplates that passivation gases such as $CCl_4$, $CHCl_3$, $C_xH_yCl_z$ or $BCl_3$, for example, can be used in such an embodiment, possibly in combination with $SiCl_4$ for GaAs/AlGaAs etching. These passivation gases result in the formation of suitable stable side wall passivation layers including, for example, organic chlorocarbons, chlorohydrocarbons or the $BCl_3$ analog and are optionally crosslinked by a silicon structure (with the addition of $SiCl_4$).

The present invention advantageously also proposes anisotropic etching of polymer layers, preferably thick polymer layers such as thick enamels (photoresist, dry resist). Dimensionally accurate structuring of thick polymers with a high aspect ratio, i.e., a great depth and small structural width, e.g., greater than 20:1, and perpendicular side walls is a key process for additive methods where such structures are produced first as a negative on IC wafers and then filled up again by electroplating. After removing the polymer mold, there ultimately remains a freely movable sensor element—the positive in molding—on active (IC) chip surface without necessitating intervention into the circuitry operation. Such additive methods are becoming increasingly important in the manufacture of integrated sensors. To form the spontaneously reacting etchant species, preferably oxygen or oxygen combined with fluorine donor gases such as sulfur hexafluoride ($SF_6$) or nitrogen trifluoride ($NF_3$) is used. The actual etchant species are then fluorine and oxygen radicals. To protect it from the etching operation, the side wall passivation layer must have a very different structure from the polymer layers to be etched, but it must nevertheless retain a "soft" character so that it can be driven forward during the etching steps. Therefore, in addition to having a carbon skeleton, the side wall passivation layer also contains additional elements such as silicon, which resist the etching plasma. Polymer structures containing silicon, especially in oxide or azide bonds, are resistant to oxygen and fluorine and prevent any etching of the polymer side wall, but permit controlled erosion and forward movement of the protective film. According to the present invention, hydrocarbons containing metals or hydrocarbons with a high aromatic ring content (n-phenyls) are suitable side wall passivation gases. In an especially preferred manner, monosilane ($SiH_4$), HMDS (hexamethyldisilane), HMDSO (hexamethyldisiloxane) or HMDSN (hexamethyldisilazane) are used, with $SiF_4$ optionally also being added as a crosslinking agent to create a silicon skeleton. Accordingly, a mixture of fluorocarbons and $SiF_4$ or $SiH_4$ results in the development of an organic polymer material that contains silicon and conforms to the process claims ($C_xF_yH_z$ + $w.SiF_4 \rightarrow C_x, F_y, H_z, Si_w$ +HF, F, CF (silicon fluorocarbon)+F) (similarly for $SiH_4$ instead of $SiF_4$). Then, for example, thin metal masks of aluminum, chromium, nickel, etc. or plasma CVD layers or oxide layers such as $Al_2O_3$, etc. can be used as masking layers.

DETAILED DESCRIPTION OF THE INVENTION

Figure 1:
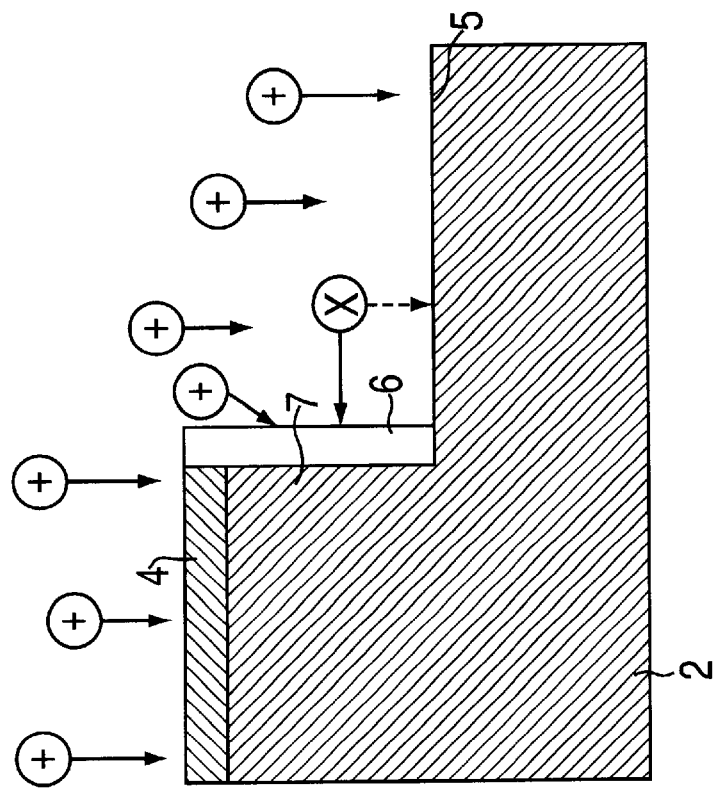
FIG. 1 shows a schematic diagram of application of a side wall passivation layer.

FIG. 1 shows a gallium/arsenic substrate 2, which is coated with an etch resist 4 produced from a photoresist, for example, with etch resist 4 leaving exposed area 5 of substrate 2 which is to be etched anisotropically. Side wall 7 is passivated by a passivating gas (x in a circle), which may be, for example, a mixture of $BCl_3$ and $SiCl_4$ or $CCl_4$ and $BCl_3$, etc. The mixture has a gas flow of 10–100 sccm and a process pressure of 20 $\mu$bar=2 Pa. A microwave field or a high frequency field between 500 and 1000 W is applied through an injection device for electromagnetic fields, such as microwaves, thereby creating a high-density plasma. During passivation, low-energy ions (+ in a circle) may be made to act on the substrate at the same time. As a result, no passivation layer is applied to etching ground 5. The passivating monomers accumulate preferentially on side walls 7, where they form wall side passivation layer 6. The bombardment of low-energy ions on substrate 2 is controlled by a substrate electrode. For this purpose, a high-frequency power of 10 W, for example, is applied to the substrate electrode, thus yielding a substrate bias of 30 V, for example. The ion energy is then approximately 40 eV, for example.

As an alternative, it is also possible to omit bombardment with low-energy ions during the passivation step. Thus, not only side wall 7 but also etching ground 5 are uniformly covered with a passivation layer during the passivation step. The passivation layer applied to etching ground 5 is broken through rapidly during the subsequent etching operation, because the passivation layer is eroded very rapidly with the ion support of the etching step. Side wall 7 of the structure to be etched is struck by ions only to a comparatively minor extent, so it remains protected by the side wall passivation layer during the etching operation. However, side wall bombardment is important in achieving the forward movement of the side wall film. It is controlled by the density of the ions, their acceleration toward the substrate and the pressure (collision rates).

Figure 2:
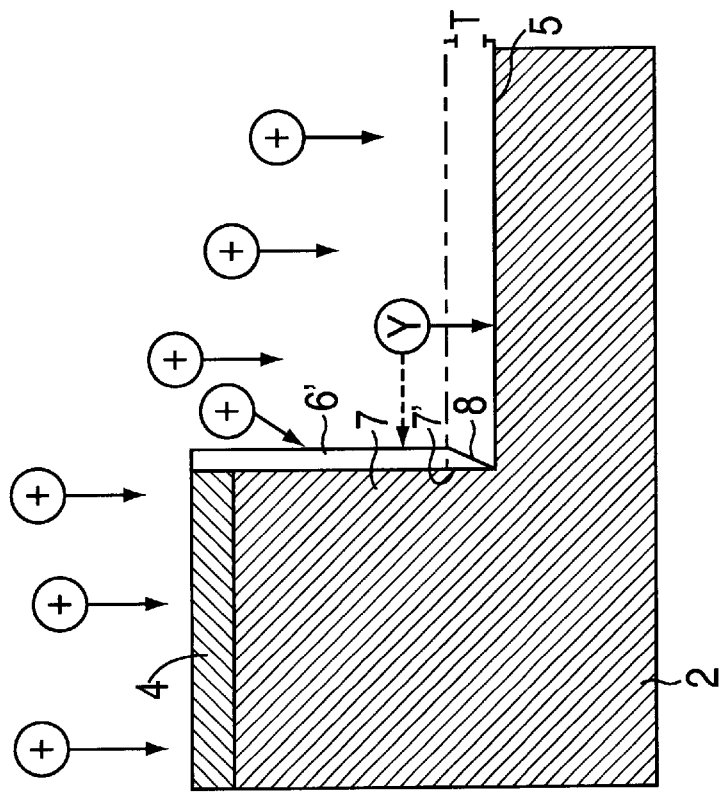
FIG. 2 shows a schematic diagram of the etching operation with the side wall passivation layer driven forward at the same time.

FIG. 2 illustrates the etching operation in a method according to the present invention. Under the influence of a low-energy ion source (+ in a circle), substrate 2 is exposed to the etching plasma or etching chemistry. An etchant species such as chlorine (y in a circle) that reacts spontaneously with the substrate material is used, having a gas flow between 50 and 200 sccm and a process pressure between 10 and 30 $\mu$bar (=1–3 Pa). The plasma is generated preferably with a high-frequency or microwave radiation between 300 and 1200 W. A substrate bias is applied to the substrate electrode to accelerate the ions. The substrate bias is preferably between 30 and 40 V and can be achieved with a high-frequency power supply of 10 to 15 W. During the etching operation, chemically reactive species and electrically charged particles are produced in a high-density plasma with the help of the electric discharge. The positively charged ions generated in this way are accelerated toward substrate 2 by the electric bias applied to the substrate electrode, striking substrate surface 5, which has been left exposed by etch resist 4, approximately at right angles, and supporting the chemical reaction of the reactive plasma species with gallium/arsenic substrate 2. The reactive plasma species etches away the multicomponent system isotropically and nonspecifically. Side wall 7 of substrate 2 is protected by side wall passivation layer 6. Since chlorine is a spontaneously reacting etchant species with respect to AlGaAs (but not with respect to silicon, as described above), initiation or support by incident ions can essentially be omitted for the etching operation itself. However, incident ions are necessary to drive side wall passivation layer 6 forward, to keep etching ground 5 free of deposits from the plasma and, if ion support has been omitted during passivation, to erode and break through the passivation layer on etching ground 5. Ions incident at a small angle to the perpendicular (angle $\alpha$ in FIG. 3), which therefore strike side wall passivation layer 6, support the removal of partial side wall passivation layer 6 and cause it to become thinner 6'. During the etching operation, etching ground 5 is etched down by depth T, thus forming a surface 7' of side wall 7 which was not originally covered by side wall passivation layer 6. The polymer clusters of side wall passivation layer 6 exposed by the primarily obliquely incident ions tend to be deposited in the immediate vicinity and then cover exposed surface 7' of side wall 7 as portions of passivation layer 8 containing original side wall passivation layer 6, so that it is protected immediately when it is exposed, not just later in the next passivation step. Isotropic etching of surface 7' and thus scoring of the side wall are prevented.

Figure 3:
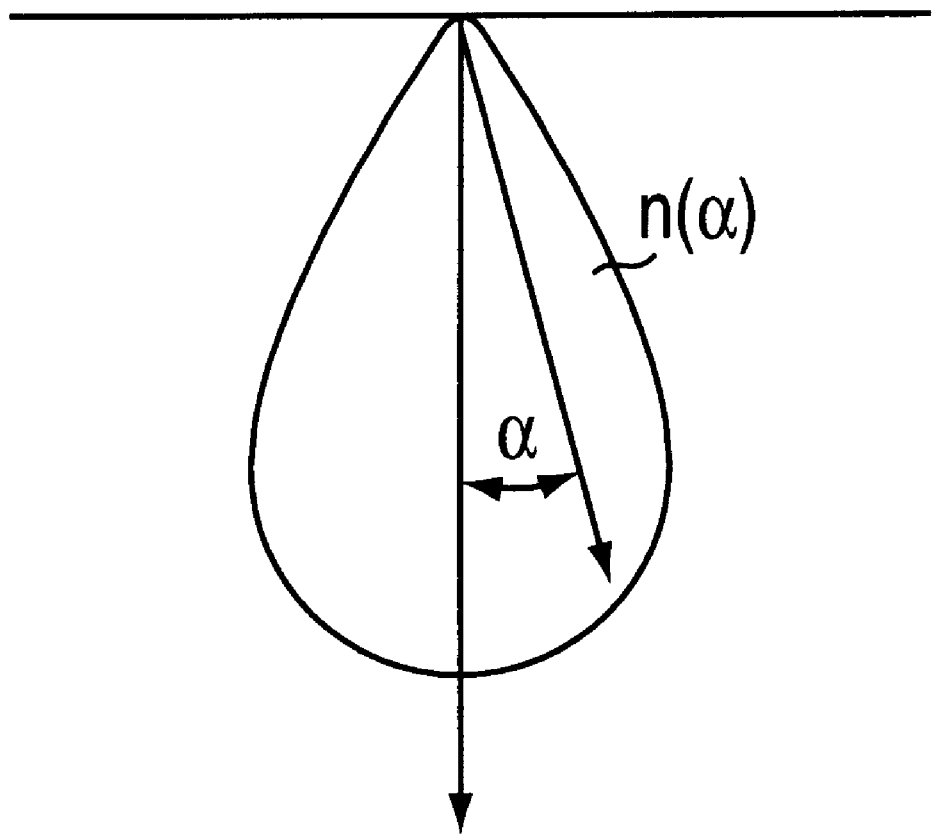
FIG. 3 shows a schematic diagram of a suitable ion distribution according to the present invention.

Controlled oblique bombardment of low-energy ions on the substrate surface is achieved by a combination of the process pressure, plasma density and thus the collision rate in the plasma (i.e., the level of incident HF (high-frequency) power or microwave power into the high density plasma source) and the ion accelerating voltage at the substrate electrode and its variation over time. At a process pressure between 10 and 100 $\mu$bar, preferably 20 $\mu$bar, and at a high ion density of $2\times10^{11}$ cm$^{-3}$ to $5\times10^{12}$ cm$^{-3}$, preferably $1\times10^{12}$ cm$^{-3}$, a divergent ionic current develops due to the mutual repulsion of the positively charged species of a very high density and due to a diffusion of ions out of regions of a high ion density into regions of a low ion density, such as those around the wafer. This divergent ionic current to the substrate is bundled again by the accelerating voltage toward the substrate, so that a more or less narrowly directed ionic current strikes the substrate electrode. The higher the ion accelerating voltage selected in relation to the ion density, the more sharply bundled is the direction distribution (FIG. 3: n($\alpha$)) of the ions, i.e., the fewer obliquely incident ions are observed. The number of ions at a certain angle $\alpha$ is reduced and shifted in the direction of smaller angles (FIG. 3). With a higher energy, however, the erosion effect of the ions increases, i.e., their destructive power for the side wall film in oblique bombardment on the side wall increases, which partially compensates for their lower numbers at this angle. Consequently, a relatively wide process window is available in which the mechanism functions usefully (voltages between 10 and 100 V, preferably 30–50 V), and the influence on the result of the operation is a continuous function, which permits simple optimization on the basis of the profile shape. If the substrate bias is induced by HF power on the substrate electrode, as is generally the case, it is advantageous to take into account the ionic current in the range of the zero crossings of this HF voltage, within which very low-energy ions strike the wafer surface with a high divergence and discharge it (high-density plasma).

The etching step can be carried out, for example, until achieving an etching depth of approximately 2' to approximately 3 $\mu$m. At high erosion rates from high density plasmas, this requires a time of six seconds to one minute, for example, for the etching step.

In a subsequent passivation step, thinned side wall passivation layer 6' applied last and passivation layer 8 on newly formed side wall surface 7' are again increased to the original thickness of side wall passivation layer 6 before being etched again, and side wall passivation layer 6 is again shifted slightly downward. The etching operation and passivation are repeated alternately until reaching the predetermined etching depth of the structures in the substrate. With a microwave-supported method (to produce high-density plasmas), which permits an etching rate between 2 and 20 $\mu$m/min, for example, the duration of the individual etching operations is such that etching is continued by a depth of 2 to 3 $\mu$m per etching step. Passivation is continued until a side wall passivation layer 6 approximately 5 to approximately 200 nm thick, preferably 50 nm thick, composed of the species described here is deposited. Generally, this requires a period of five seconds to one minute.

Anisotropic etching with very low ion energies can be achieved in an advantageous manner. If no passivation layer is to be applied to etching ground 5 during passivation, ion energies of only approximately 10 to approximately 20 eV are sufficient in principle. During the etching operation, ion bombardment with energies between 30 and 50 eV is provided according to the present invention to keep the base of the structure free of deposits from the plasma and to maintain the side wall film dynamics.

Since the method according to the present invention involves high etching rates, heating of the substrate may occur. Therefore, it is necessary to provide cooling for the substrates. This can be accomplished, for example, by cooling the back of the substrate with a stream of helium gas, with an elastomer or by gluing the substrate to a cooled electrode.

It is advantageous according to the present invention for the plasma sources used to have high densities of reactive species and ions with a low but, at the same time, accurately controllable energy with which the ions generated reach the substrate. The ion energy must be minimized for high mass selectivity. High ion energies also result in interfering reactive effects of atomized or eroded materials redeposited in an uncontrolled manner. The energy of the ions acting on the substrate must of course be sufficient to keep the base of the structure free of deposits and thereby produce a smooth etching ground.

What is claimed is:

1. A method for achieving anisotropic etching results in producing an etched structure in a substrate, comprising the steps of:
    performing a side wall passivation to apply a side wall passivation layer to a side wall of the substrate, the substrate including at least one of a polymer material, a metal and a multicomponent system;
    performing an isotropic etching operation separately from the side wall passivation step, the isotropic etching operation being alternatingly performed with the side wall passivation step,
    wherein during the isotropic etching operation, a portion of the side wall passivation layer applied during the side wall passivation step is transferred to an exposed side face of the side wall.

2. The method according to claim 1, further comprising the step of:
    controlling a bombardment of ions impinging on the side wall using a combination of a high plasma density, a low process pressure and a low ion acceleration,
    wherein the ions impinge on the side wall at an oblique angle with respect to a plane including the side wall.

3. The method according to claim 1, wherein the step of performing the isotopic etching operation includes the step of exposing the substrate to low-energy incident ions.

4. The method according to claim 1, wherein the step of performing the side wall passivation includes the step of exposing the substrate to low-energy incident ions.

5. The method according to claim 2, wherein the step of performing the side wall passivation includes the step of lowering an ion energy, the ion energy not causing the ion acceleration.

6. The method according to claim 1, wherein the step of performing the isotropic etching operation includes the steps of (a) partially eroding the side wall passivation layer using a small dose of incident ions, the small dose of the incident ions being accurately controlled, the incident ions impinging the side wall passivation layer at an oblique angle, and (b) shifting the portion of the side wall passivation layer in a direction of the isotropic etching operation to protect the exposed side face.

7. The method according to claim 6, wherein the small dose of the incident ion has a low energy.

8. The method according to claim 1, wherein the multicomponent system includes at least one of a gallium/arsenic material and an aluminum/gallium/arsenic material.

9. The method according to claim 1, wherein the polymer material includes at least one of a thick photoresist and a dry resist.

10. The method according to claim 1, wherein the step of performing the isotropic etching operation includes the step of performing the isotropic etching operation using spontaneous reacting etchant species.

11. The method according to claim 1, wherein the step of performing the isotropic etching operation includes the step of performing the isotropic etching operation using at least one of chlorine, oxygen, and a fluorine donor gas.

12. The method according to claim 11, wherein the fluorine donor gas includes one of a sulfur hexafluoride, a nitrogen trifluoride and a tetrafluoromethane.

13. The method according to claim 11, wherein the fluorine donor gas is mixed with one of an argon gas and a further inert gas.

14. The method according to claim 13, wherein the further inert gas includes at least one of a helium gas and a xenon gas.

15. The method according to claim 1, wherein the step of performing the side wall passivation includes the step of performing the side wall passivation using at least one of carbon tetrachloride, trichloromethane, $C_xH_yCl_z$, $BCl_3$, silicon tetrachloride trifluoromethane, silicon tetrafluoride, silane, and a mixture including at least one of halohydrocarbons and $SiF_4/SiCl_4$, silane, hexamethyldisilane, hexamethyldisiloxane, hexamethyldisilazane, metallohydrocarbon, fluorohydrocarbons, hydrocarbon with at least one of a high aromatic ring content, perfluorinated aromatics, perfluorinated styrene derivatives and fluoroether compounds.

16. The method according to claim 1, wherein the step of performing the isotropic etching operation includes the step of performing the isotropic etching operation with an ion energy between 10 eV and 100 eV.

17. The method according to claim 1, wherein the step of performing the isotropic etching operation includes the step of performing the isotropic etching operation with an ion energy between 30 eV and 50 eV.

18. The method according to claim 1, wherein the step of performing the side wall passivation includes the step of performing the side wall passivation with an ion energy between 10 eV and 50 eV.

19. The method according to claim 1, wherein the step of performing the side wall passivation includes the step of performing the side wall passivation with an ion energy between 30 eV and 40 eV.

20. The method according to claim 1, wherein the step of performing the side wall passivation includes the step of performing the side wall passivation with an ion energy between 0 eV and 10 eV, without a bias voltage.

21. The method according to claim 1, wherein the step of performing the isotropic etching operation includes the step of performing the isotropic etching operation using an etching medium and the step of performing the side wall passivation includes the step of performing the side wall passivation using the etching medium, the etching medium having a gas flow of between 10 sccm and 200 sccm and a process pressure of between 10 $\mu$bar and 100 $\mu$bar during an oblique bombardment of ions, the process pressure being 0 $\mu$bar in an off state.

22. The method according to claim 1, wherein a plasma production is performed by one of a microwave injection and a high-frequency setting at powers of between 100 W and 1500 W.

23. The method according to claim 1, wherein a plasma production is performed by one of a microwave injection and a high-frequency setting at powers of between 300 W and 1200 W.

24. The method according to claim 1, wherein at least one of the step of performing the isotropic etching operation and the step of performing the side wall passivation includes the step of cooling the substrate.

25. The method according to claim 1, wherein the step of performing the isotropic etching operation includes the step of performing the isotropic etching operation using a high plasma density of reactive species and ions and the step of performing the side wall passivation includes the step of performing the side wall passivation using the high plasma density of reactive species and ions.

26. The method according to claim 1, wherein an ion density, an ion energy and a ratio of charged particles to uncharged particles are controlled independently of one another.

* * * * *